(12) United States Patent
Misewich et al.

(10) Patent No.: US 6,426,536 B1
(45) Date of Patent: Jul. 30, 2002

(54) DOUBLE LAYER PEROVSKITE OXIDE ELECTRODES

(75) Inventors: James A. Misewich, Peekskill, NY (US); Ramamoorthy Ramesh, Silver Spring, MD (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/835,509

(22) Filed: Apr. 16, 2001

(51) Int. Cl.[7] .......................... H01L 29/76; H01L 29/94; H01L 31/062; H01L 31/113; H01L 31/119
(52) U.S. Cl. ........................................ 257/410; 257/295
(58) Field of Search ............................ 257/758, 43, 38, 257/39, 40, 286, 289, 295, 382, 383, 410, 411, 412, 413, 414

(56) References Cited

U.S. PATENT DOCUMENTS 5,418,389 A * 5/1995 Watanabe .................... 257/295
6,333,543 B1 * 12/2001 Schrott et al. ............... 257/410

OTHER PUBLICATIONS

J.A. Misewich and A.G. Schrott "Room–Temperature Oxide Field–Effect Transistor with Buried Channel", *Appl. Phys. Lett.* 76, 3632–34 (2000).
Ramesh et al. "Ferroelectric La–Sr–Co–O/Pb–Zr–Ti–O/La–Sr–Co–O Heterostructures on Silicon via Template Growth" *Appl. Phys. Lett.* 63, 3592–94 (1993).
Strobel et al. "Crystal Growth and Characterization of the Superconducting Phase in the Bi–Sr–Cu–O System" *Physica C* 156 434–40 (1988).
Foster et al. "Properties Variation with Composition of Single–Crystal $Pb(Zr_xTi_{1-x})O_3$ Thin Films Prepared by MOCVD" *Mat. Res. Soc. Symp. Proc.* 401, 139–49 (1996).
Yu et al. "Growth of Highly c–Axis–Oriented $Pb(Zr_{0.53}Ti_{0.47})O_3$ Thin Films on $LaNiO_3$ Electrodes by Pulsed Laser Ablation" *Mater. Lett.* 26, 291–94 (1996).
Ganpuel et al. "Scaling of Ferroelectric Properties in Thin Films" *Appl. Phys. Lett.* 75, 409–11 (1999).
Sakoda et al. "Characterization of Sputtered Lead–Zirconate–Titanate Thin Films with Various Compositions" *Jpn. J. Appl. Phys.* 38, 3600–03 (1999).
Schrott et al. "Mott Transition Field Effect Transistor:Experimental Results" *Mat. Res. Soc. Proc.* 574, 243–48 (1999).

* cited by examiner

Primary Examiner—David Nelms
Assistant Examiner—Andy Huynh
(74) Attorney, Agent, or Firm—Marian Underweiser, Esq.; Martha L. Boden, Esq.; Heslin Rothenberg Farley & Mesiti P.C.

(57) ABSTRACT

A method for constructing oxide electrodes for use in an OxFET device is disclosed. The electrodes are formed by first depositing a double layer of conducting perovskite oxides onto an insulating oxide substrate. A resist pattern with the electrode configuration is then defined over the double layer by means of conventional lithography. The top oxide layer is ion milled to a depth preferably beyond the conducting oxide interface, but without reaching the substrate. Chemical etching or RIE is used to remove the part of the lower conductive oxide layer exposed by ion milling without damaging the substrate. Source and drain electrodes are thereby defined, which can be then be used as buried contacts for other perovskites that tend to react with metals. Also disclosed is a field effect transistor structure which includes these source and drain electrodes in a buried channel configuration.

9 Claims, 4 Drawing Sheets

DOUBLE LAYER PEROVSKITE OXIDE ELECTRODES

FIELD OF THE INVENTION

The present invention relates generally to the preparation of field effect transistors, and more particularly to the preparation of perovskite conductive oxide electrodes for use in such devices.

BACKGROUND OF THE INVENTION

Recently, oxide channel field effect transistors (OxFET) have been developed which incorporate perovskite oxides into their design. These devices are similar in architecture to conventional field-effect transistors (FET) with source, drain and gate electrodes, and a channel. However, instead of the use of a semiconductor material, such as silicon, the channel is made from a material capable of undergoing a field induced Mott metal-insulator transition at room temperature. Exemplary channel materials include oxides from the cuprate family of perovskite structure materials related to high temperature superconductors.

Perovskite oxides exhibit a wide range of behavior depending on chemical composition, temperature, electric fields, and magnetic fields. Insulating, metallic and superconducting phases have been identified, and devices based on epitaxial heterostructures such us high-TC Josephson tunnel junctions, superlattices, and the aforementioned oxide channel field effect transistors (OxFET) have been fabricated and are becoming increasingly attractive. Oxide-channel field effect transistors (OxFET) are of particular interest because of the potential to scale such devices beyond the silicon scaling limits, due to the absence of impurity doping in the oxides and because the charge separation layer at the source and drain contacts can be about 1 Angstrom rather than 100 Angstroms.

As stated above, the Mott transition channel in OxFETs is preferably selected to be a perovskite-structure cuprate compound. These materials have the advantage of being compatible with single-crystal materials such as strontium titanate (chemical formula $SrTiO_3$) (hereinafter, STO), lanthanum aluminate, $LaAlO_3$ (hereinafter, LAO), strontium lanthanum aluminate, $SrLaAlO_4$ (hereinafter, SLAO), barium strontium titanate, $Ba_xSr_{(1-x)}TiO_3$ (hereinafter, BST) or neodymium gallinate, $NdGaO_4$ (hereinafter NGO), all of which are good electrical insulators, making them useful as substrate materials. Furthermore, the perovskite channel materials can be grown epitaxially on single crystal substrates of STO, LAO, SLAO, BST, or NGO. Examples of such channel oxides include, but are not limited to, lanthanum cuprate, $La_2CuO_4$ (hereinafter, LCO), yttrium praseodymium barium cuprate, $Y_xPr_{1-x}Ba_2CU_3O_{7-\delta}$ (hereinafter, YPBCO), and yttrium barium cuprate, $YBa_2Cu_3O_{7-\delta}$ (hereinafter YBCO), which are p-type materials; and neodymium cuprate, $Nd_2CuO_4$ (NCO) and other n-type materials.

In one OxFET device design, the channel oxide is buried beneath the gate oxide material. FIG. 1 shows a cross section of one such OxFET device 10 in which Mott transition oxide channel 195 is buried under gate oxide material 200. In order to make electrical contact, this design requires buried electrodes, shown as source 60 and drain 70. During fabrication of the device, source 60 and drain 70 electrodes are present on substrate 120 during deposition of the active oxide layers 195 and 200. Because the latter deposition is performed with the substrate at a temperature (T)>500° C., and because of their physical proximity to the electrodes, the reactivity and epitaxial compatibility of gate oxide 200 and channel oxide 195 with the electrodes is an important parameter that affects the performance of these complex devices. Source 60 and drain 70 electrodes have traditionally been made from platinum and other conductive metals, but unfortunately, perovskite oxides exhibit contact resistance with such metal electrodes, thereby creating difficulties in fabricating devices with certain degrees of complexity.

Thin film capacitors having epitaxial metal oxide electrodes, such as lanthanum strontium cobalt oxide, $LaSrCoO_3$ (hereinafter LSCO) or lanthanum nickel oxide, $LaNiO_3$ (hereinafter, LNO), have been prepared. Generally, these electrodes are deposited onto single crystal substrates, such as strontium titanium oxide, $SrTiO_3$ (hereinafter STO) or lanthanum aluminum oxide, $LaAlO_3$ (hereinafter, LAO) using pulsed laser ablation techniques. Such work is reported by T. Yu et al. in *Mater. Lett.* 26, 291–94 (1996). Because these electrodes do not react with perovskite oxides, they provide good electrical contacts for use in capacitors. However, it is impractical to use these electrodes by themselves in buried oxide FET device designs because necessary mechanical and chemical processing techniques either damage the underlying substrate or do not provide an adequate etch stop, thereby precluding good epitaxial growth of an oxide channel.

To get the maximum benefit from buried perovskite oxide FET devices, it is therefore clear that a need still exists for the development of electrodes capable of providing good ohmic (electrical) contact to channel oxides. To minimize contact resistance, such electrodes should be made from materials such as conductive metallic oxides, rather than pure conductive metals. Furthermore, the fabrication of such electrodes should preserve the relevant parts of the substrate for good epitaxial growth of channel oxides. A need also exists for an OxFET structure that incorporates such conductive metal oxide electrodes therein as buried source and drain electrodes and that incorporates the buried oxide channel design. To fulfill these needs, a method of preparing the electrodes and the FET structure is also desirable. The present invention meets these needs.

SUMMARY OF THE INVENTION

Briefly, in one aspect, the present invention provides a method for fabricating perovskite oxide electrodes. Such electrodes are particularly useful as buried source and drain electrodes in an OxFET type device having a buried oxide channel. An unexpected advantage of the method for preparing the electrodes is that the underlying substrate is not damaged during the fabrication process. The inventive method for fabricating two electrodes (a first and second electrode), particularly useful as source and drain electrodes, comprises:

(A) providing a substrate;

(B) depositing a layer of a lower conductive oxide onto the substrate;

(C) depositing a coating of an upper conductive oxide onto the layer of the lower conductive oxide;

(D) patterning the upper conductive oxide coating to create a cavity therein, wherein the cavity extends in depth through the upper conductive oxide coating at least to the lower conductive oxide layer without extending to the substrate, wherein the cavity exposes a portion of the lower conductive oxide layer; and (E) removing the exposed portion of the lower conductive oxide layer from the bottom of the cavity to expose a region of the substrate, whereby the first and second electrodes, each comprising the lower and upper conductive oxides, and each electrically and laterally separated one from the other by the exposed substrate region, are formed. The first electrode covers a first area of the substrate, and the second electrode covers a second area of the substrate.

In another aspect, the invention provides a first and second electrode prepared by the method set forth above. As mentioned, the first and second electrodes are particularly useful as the source and drain electrodes, respectively, in an OxFET device.

In yet another aspect, the present invention provides a field effect transistor structure, which incorporates the above fabricated electrodes as source and drain electrodes buried beneath active oxides. The structure comprises:

(A) a substrate;

(B) a source electrode comprising a lower conductive oxide disposed atop a first area of the substrate and an upper conductive oxide disposed atop the lower conductive oxide;

(C) a drain electrode laterally separated from the source electrode, wherein the drain electrode comprises the lower conductive oxide disposed atop a second area of the substrate and the upper conductive oxide disposed atop the lower conductive oxide;

(D) a channel oxide layer atop an exposed region of the substrate and atop the source and drain electrodes, wherein the exposed region lies between and laterally separates the source electrode and the drain electrode, wherein the channel oxide layer covering the exposed region forms a channel in the device;

(E) a gate oxide material covering the channel oxide layer;

(F) a first and a second filled contact opening, each extending, respectively, in depth through the gate oxide material and the channel oxide layer to the upper conductive oxide of the source and drain electrodes, and each filled contact opening being filled with a conductive metal; and (G) a gate electrode disposed atop the gate oxide material, wherein the gate electrode is laterally positioned between the first and second filled contact openings.

In still another aspect, the present invention provides a method for fabricating the field effect transistor device described above. The method comprises:

(A) providing a substrate;

(B) depositing a layer of a lower conductive oxide onto the substrate;

(C) depositing a coating of an upper conductive oxide onto the layer of the lower conductive oxide;

(D) patterning the upper conductive oxide coating to create a cavity therein, wherein the cavity extends in depth through the upper conductive oxide coating at least to the lower conductive oxide layer without extending to the substrate, wherein the cavity exposes a portion of the lower conductive oxide layer;

(E) removing the exposed portion of the lower conductive oxide layer from the bottom of the cavity to expose a region of the substrate, whereby a source electrode and a drain electrode are formed, each comprising the lower and upper conductive oxides, and each electrically and laterally separated one from the other by the exposed substrate region, wherein the source electrode covers a first area of the substrate, and the drain electrode covers a second area of the substrate;

(F) depositing a channel oxide layer onto the exposed substrate region, filling the cavity, and extending onto the upper conductive oxide coating;

(G) depositing a gate oxide material onto the channel oxide layer;

(H) creating a first contact opening and a second contact opening in the gate oxide material, each contact opening extending in depth through the gate oxide material and the channel oxide layer, and terminating, respectively, at the source electrode and the drain electrode;

(I) filling the first and second contact openings with a conductive metal; and (J) depositing a gate electrode atop the gate oxide material, wherein the gate electrode is positioned laterally between the first and second filled contact openings.

In preferred embodiments, the first and second electrodes are, respectively, the source and drain electrodes of a FET. Furthermore, the substrate preferably comprises strontium titanate (STO), lanthanum aluminate (LAO), strontium lanthanum aluminate (SLAO), neodymium gallinate (NGO), or barium strontium titanate (BST), but most preferably STO. The preferred lower conductive oxide material is lanthanum strontium cobalt oxide, $LaSrCoO_3$ (LSCO) or lanthanum nickel oxide, $LaNiO_3$ (LNO), and the preferred upper conductive oxide material is strontium ruthanate, $SrRuO_3$ (hereinafter, SRO). The preferred method of patterning the upper conductive oxide material is ion milling, and the preferred method of removing the lower conductive oxide material is wet chemical etching by which the upper conductive oxide layer and the substrate are unaffected. Thus, a perovskite oxide channel of good quality can be epitaxially grown on the substrate region exposed by the process.

BRIEF DESCRIPTION OF THE DRAWINGS

The subject matter, which is regarded as the invention, is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

BEST MODE FOR CARRYING OUT THE INVENTION

As noted, the present invention includes a method for fabricating conductive oxide electrodes which provide good electrical contact with other oxides, such as perovskite-type cuprates. Furthermore, these novel electrodes do not react chemically with the oxides during high temperature deposition, and therefore may be used in buried channel oxide devices. In addition, the inventive method for preparing the electrodes preserves the relevant parts of an underlying substrate for good epitaxial growth. The invention takes advantage of the fact that certain conductive oxides, such as strontium ruthanate (SRO), for example, not only provide good ohmic contact with many complex perovskite oxides used for their semiconductor, superconductor or ferroelectric properties, but also that SRO is resistant to chemical etching.

Figure 1:
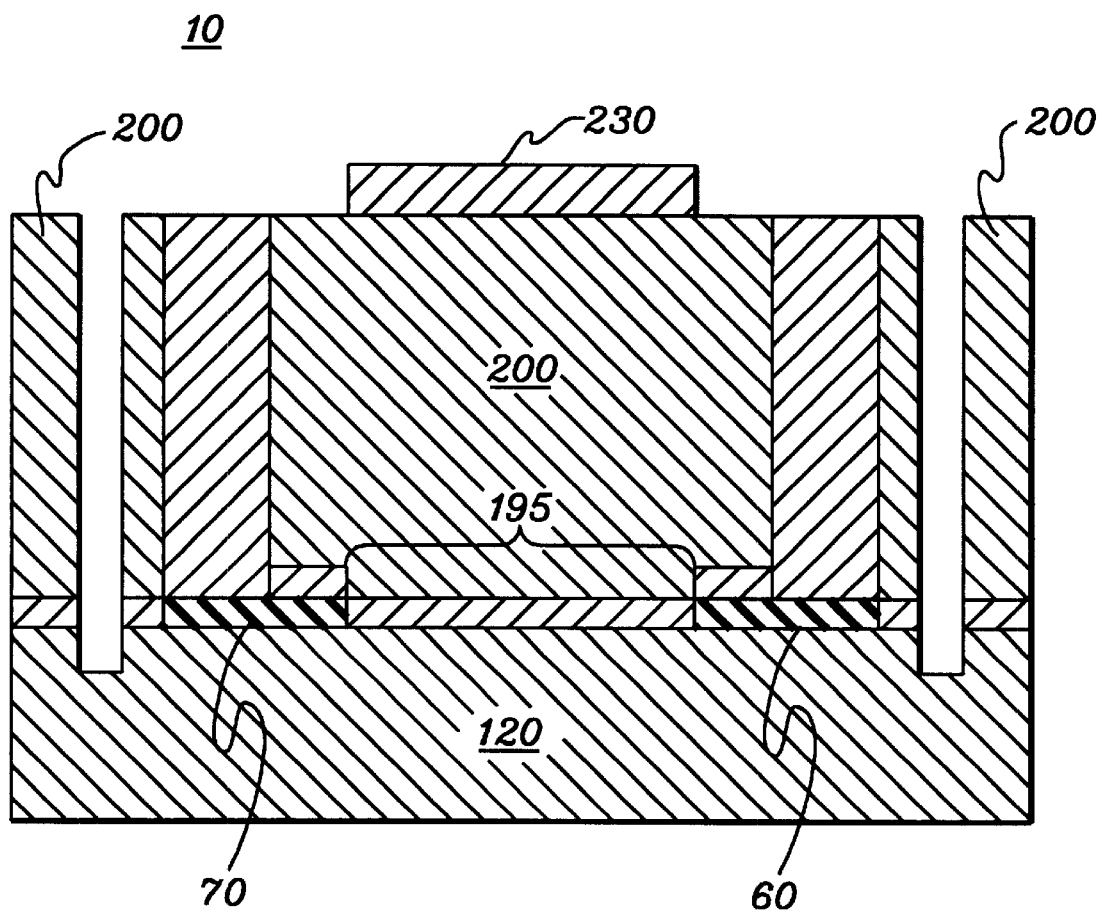
FIG. 1 is a cross-sectional view of a prior art OxFET device having buried source and drain electrodes comprising platinum.
Figure 2:
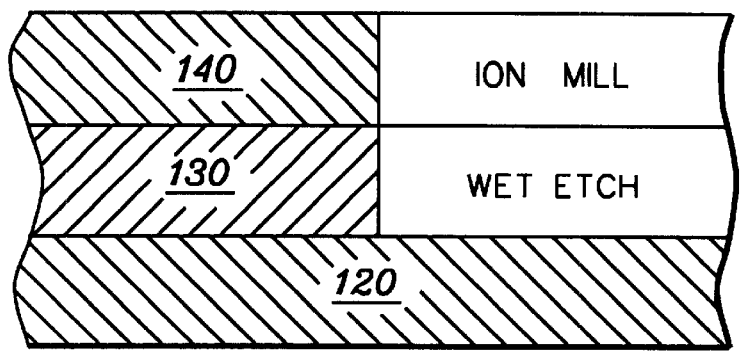
FIGS. 2–4 are cross-sectional views of one embodiment showing the fabrication of perovskite electrodes, in accordance with the present invention.
Figure 3:
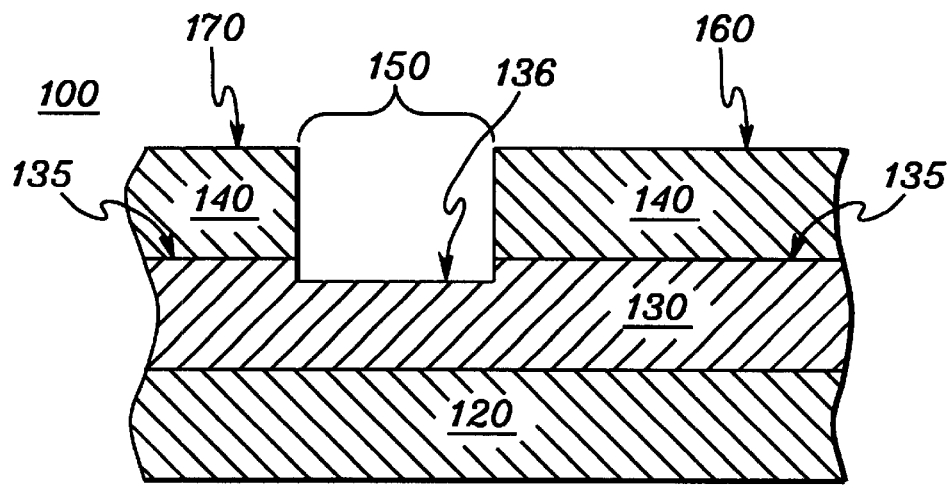
Figure 4:
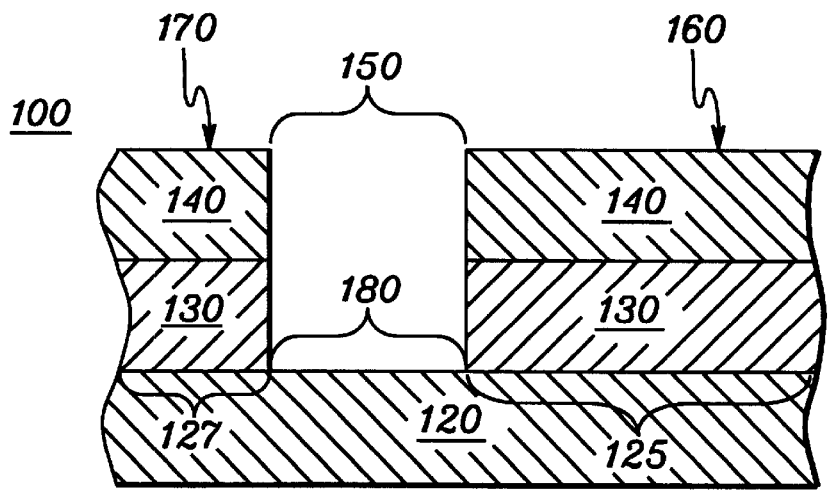

Reference should now be made to the drawings in which the same reference numbers are used throughout the different figures to designate the same or similar components. FIGS. 2–4 show cross-sections of a portion 100 of an OxFET structure which illustrates the method for fabricating first and second conductive oxide electrodes compatible for use with perovskite-type oxides. Briefly, FIG. 2 shows a double layer of conducting oxides (130 and 140) disposed atop an insulating oxide substrate 120, which has been provided. Both layers (130 and 140) must be intrinsically electrically conductive, and upper layer 140 must be resistant to chemical etching and/or reactive ion etching. The oxide layers may be conventionally deposited by pulsed laser ablation or sputtering techniques commonly known to those of skill. Lower conductive oxide layer 130 must be capable of being chemically etched or reactive ion etched.

Oxides for use as lower conductive oxide layer 130 include, but are not limited to, lanthanum strontium cobalt oxide, $LaSrCoO_3$ (LSCO) and lanthanum nickel oxide, $LaNiO_3$ (LNO). Lower conductive oxide layer 130 is deposited to a thickness in the range of about 5–50 nm onto substrate 120, which is preferably a single-crystal insulating oxide, such as strontium titanate (STO), lanthanum aluminate (LAO), barium strontium titanate, $Ba_xSr_{(1-x)}TiO_3$ (BST), strontium lanthanum aluminate, $SrLaAlO_4$ (SLAO), or neodymium gallinate, $NdGaO_3$ (NGO). Next, upper conductive oxide coating 140, preferably comprising, but not limited to, strontium ruthanate, $SrRuO_3$ (SRO), is deposited to a thickness in the range of about 5–50 nm, by conventional pulsed laser ablation or sputtering onto lower conductive oxide layer 130. A preferred embodiment comprises STO as substrate 120; LSCO as lower conductive oxide layer 130; and SRO as upper conductive layer 140.

After the double layer (130 and 140) is deposited, a pattern with the electrode configuration is defined by means of conventional lithography using a photoresist (not shown). FIG. 2 indicates that the preferable technique of ion milling or ion bombarding to selectively remove upper conductive oxide coating 140 is performed first; then wet chemical etching or reactive ion etching to remove lower conductive oxide layer 130. As shown in FIG. 3, sample 100 is patterned, preferably by ion milling, to create cavity 150, which extends through upper conductive oxide coating 140 to a depth extending at least to lower conductive layer 130, but cavity 150 may extend beyond and below interface 135. However, ion milling is discontinued prior to reaching substrate 120, which would be damaged by such a process. Cavity 150 exposes portion 136 of lower conductive oxide layer 130.

After patterning to form cavity 150, the underlying and exposed region 136 of lower conductive oxide ( e.g., LSCO or LNO) layer 130 is then easily remo ved, preferably by etching with a diluted solution of 5% nitric acid, for example. Another exemplary chemical solution for chemical etching is a solution of 5% hydrochloric acid (HCl). However, other etching solutions will be obvious to those of ordinary skill. It is necessary that the chemical solution used in etching does not react with or affect either substrate 120 (e.g., STO, LAO, SLAO, NGO, or BST) or upper conductive oxide layer 140 (SRO). The chemical solution, eg. nitric acid solution, removes exposed portion 136 of lower conductive layer 130 at the bottom of cavity 150, thereby defining first and second electrodes 160 and 170 (see FIG. 4) on either side of exposed substrate region 180. Although the nitric solution may attack the photoresist (not shown) used to pattern upper layer 140, the already patterned upper conductive oxide layer 140 (SRO) will act as a mask for the subsequent wet etching process. Alternatively, instead of chemical etching, the conventional technique of selective reactive ion etching (RIE) could be used in a similar manner using, for example, $CF_4$, $C_2F_6$, $NF_3$, HBr, $Cl_2$, etc., which are all commonly known chemical species.

FIG. 4 shows a cross-section of structure 100 after first electrode 160 and second electrode 170 have been fabricated, as previously described. First and second electrodes 160 and 170 built in this fashion are electrically and laterally separated one from the other by exposed substrate region 180 and cavity 150. First electrode 160 covers a first area 125 of substrate 120, second electrode 170 covers a second area 127 of substrate 120. As mentioned, these electrodes are particularly useful, respectively, as source 160 and drain 170 electrodes in a buried channel oxide design because, advantageously, exposed top surface region 180 of substrate 120 remains undamaged by the fabrication process. Surprisingly, the present method preserves the locus 180 on substrate 120, which is reserved for epitaxy. Good epitaxial growth of a channel oxide layer can thus be achieved on exposed substrate region 180. Furthermore, these electrodes 160 and 170 do not chemically react with oxides, so they can be used as buried contacts for perovskites or other oxides instead of metals, which do react with the oxides.

Figure 5:
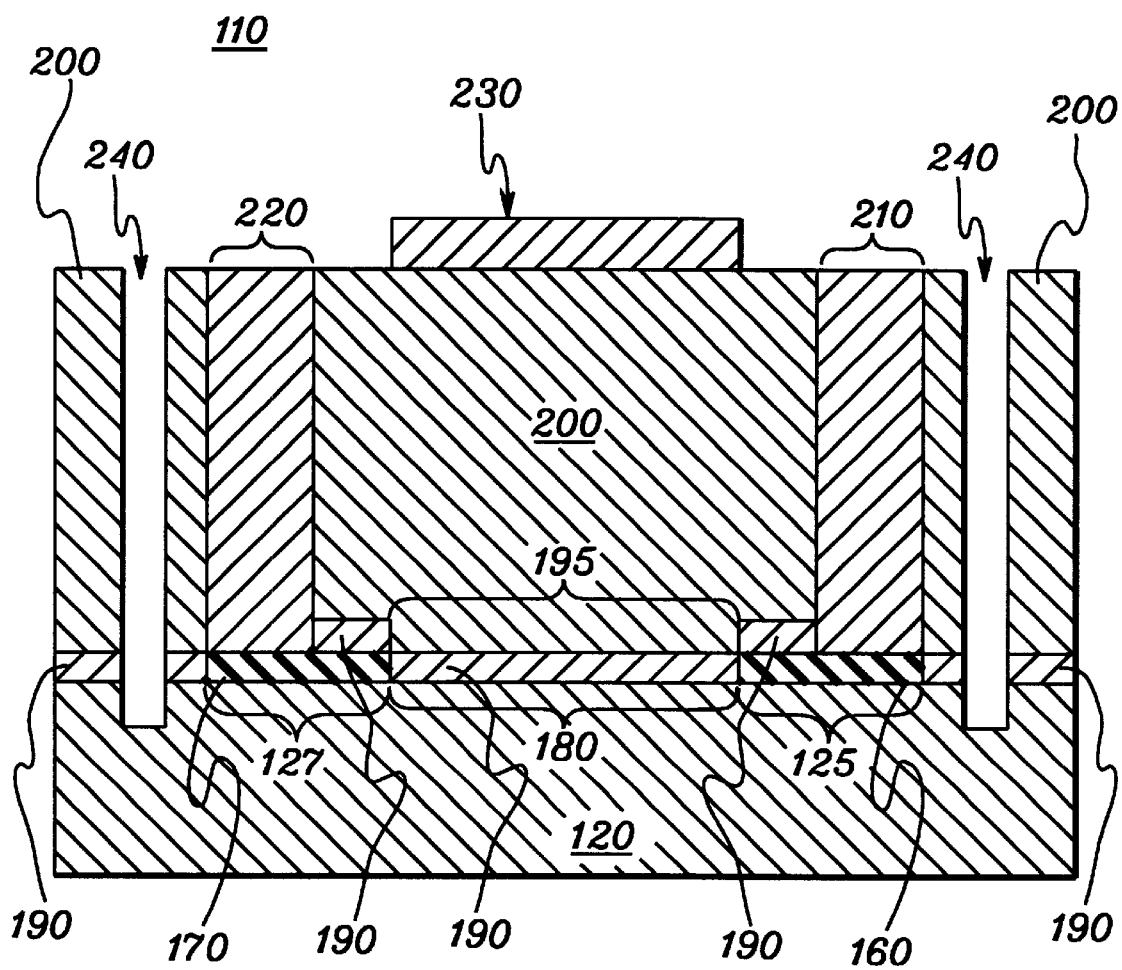
FIG. 5 is a cross-sectional view of the preferred embodiment of a completed OxFET device having buried source and drain oxide electrodes, as fabricated in FIG. 4, in accordance with the present invention.

FIG. 5 shows a cross-section of completed OxFET structure 110, which incorporates the buried source and drain electrodes 160 and 170 fabricated according to the method described above. As stated previously, in these devices, the Mott transition channel oxide layer 190 is buried under gate oxide 200.

Fabrication begins by providing substrate 120, which is typically a single crystal of STO, LAO, SLAO, BST, or NGO. Next, the procedure described above for making source electrode 160 and drain electrode 170 is followed. Source electrode 160 is disposed atop a first area 125 of substrate 120, and drain electrode 170 is disposed atop a second area 127 of substrate 120. After source and drain electrodes 160 and 170 are formed, the sample 110 is typically annealed at 700° C. for about 3 hrs. in about 100 mTorr $O_2$. Next, channel 195 is epitaxially grown on exposed single crystal STO surface 180 by means of conventional pulsed laser ablation (PLA). Channel 195 is deposited as oxide layer 190 to a thickness ranging from about 5 to about 10 nm. Layer 190 covers not only exposed region 180 of substrate 120 (forming channel 195), but also extends over source and drain electrodes 160 and 170, as well as any remaining exposed substrate. Typically, channel layer 190, and thus, channel 195, will comprise Mott transition perovskite oxides, such as $La_2CuO_4$ (LCO), $Y_xPr_{1-x}Ba_2CU_3O_{7-\delta}$ (YPBCO), $YBa_2Cu_3O_{7-\delta}$ (YBCO), or $Nd_2CuO_4$ (NCO). Other suitable channel oxide materials will be apparent to those of skill. Gate oxide material 200, which is typically, but not limited to, an insulator such as STO, BST, lead zirconate titanate, $PbZr_xTi_{1-x}O_3$ (PZT), or strontium barium niobate, $Sr_{1-x}Ba_xNb_2O_6$ (SBN) is then laser deposited to a thickness ranging from about 80 to about 50 nm. Channel oxide layer 190 (channel 195), as previously listed, is typically deposited onto substrate surface 180 at about 700° C. in about 10 mTorr $O_2$, whereas for the STO gate oxide material 200, the substrate temperature is typically about 760° C. and the $O_2$ pressure is 250 mTorr. The laser deposition is generally performed with a frequency of 4 Hz and a fluence of 2 J/cm$^2$, resulting in a deposition rate of about a tenth of a monolayer per second.

After channel oxide layer 190 and gate oxide material 200 are deposited, a first contact opening 210 and a second contact opening 220 are created in gate oxide material 200 to reach source and drain electrodes 160 and 170, respectively. This is accomplished by a combination of wet etching using a diluted solution of HF, for example, and ion milling through a lithographic mask. The contact openings extend in depth through gate oxide material 200 and the underlying channel oxide layer 190 to electrodes 160 and 170. This also separates channel 195 from the remaining layer 190. Next, first and second contact openings 210 and 220 are typically filled with a conductive metal, such as platinum (Pt) or gold (Au), for example. Other non-reactive conductive metals may be used instead, as will be obvious to those of skill. The process continues by the conventional deposition of gate electrode 230 through a lithographic mask. Gate electrode 230 is typically made of a conductive metal such as platinum, and is conventionally deposited onto gate oxide material 200. Gate electrode 230 is laterally positioned between first and second filled contact openings 210 and 220. Typically, the process is completed with the isolation of each OxFET device 110 by opening trenches 240 around the outside of each device by the same method used for opening contact openings 210 and 220.

Figure 6:
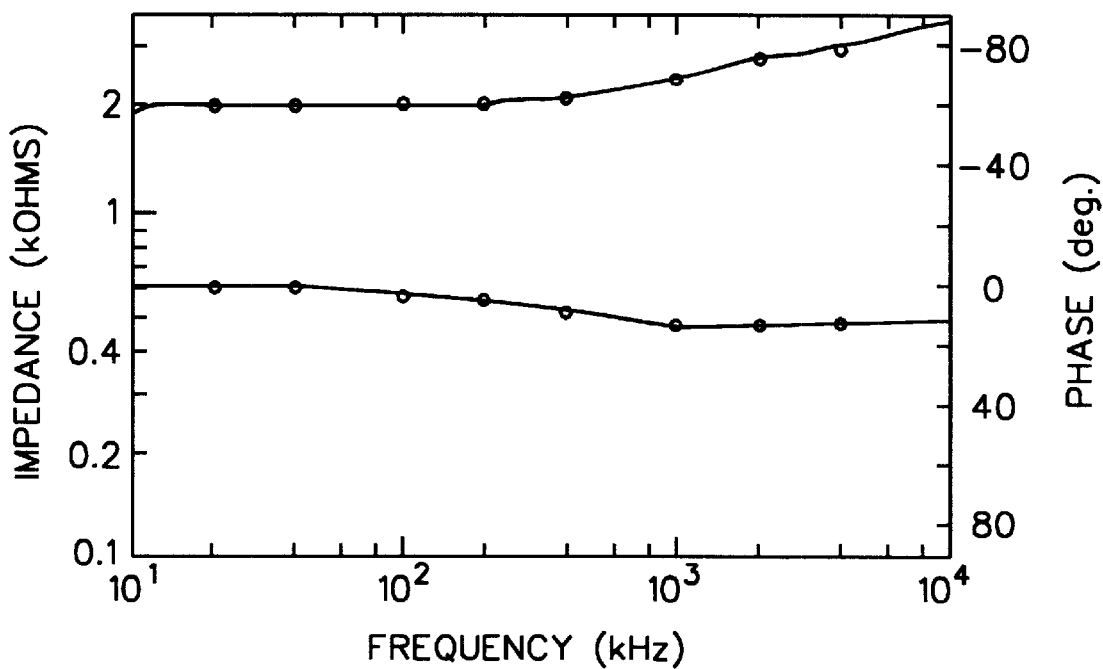
FIG. 6 is a plot of Impedance (kohms) vs. Frequency (kHZ) vs. Phase (deg) for an oxide channel material having buried oxide electrodes, in accordance with the present invention.

FIG. 6 is a plot illustrating the conductivity of a YBCO channel oxide layer 195 measured from a device having buried oxide electrodes fabricated as described above. This figure shows that the contacts (160 and 170) are now free of any capacitive contributions, and the low impedance (2 kiloohms) underscores a low contact resistance compared with conventional platinum electrodes, which would show an impedance greater than 1 Megaohm under the same conditions. In the same graph, the phase is shown. A low positive phase is indicative of low contact resistance, since poor contacts also exhibit a capacitive behavior which leads to a high negative phase value.

While the invention has been particularly shown and described with reference to preferred embodiment(s) thereof, it will be understood by those skilled in the art that various changes in form and details may be made therein without departing from the spirit and scope of the invention.

We claim:

1. A field effect transistor structure comprising:
   (A) a substrate;
   (B) a source electrode comprising a lower conductive oxide disposed atop a first area of said substrate and an upper conductive oxide disposed atop said lower conducting oxide;
   (C) a drain electrode laterally separated from said source electrode, wherein said drain electrode comprises said lower conductive oxide disposed atop a second area of said substrate and said upper conductive oxide disposed atop said lower conductive oxide;
   (D) a channel oxide layer atop an exposed region of said substrate and atop said source and drain electrodes, wherein said exposed region lies between and laterally separates said source electrode and said drain electrode, wherein said channel oxide layer covering said exposed region forms a channel in said device;
   (E) a gate oxide material covering said channel oxide layer;
   (F) a first and a second filled contact opening, each extending, respectively, in depth through said gate oxide material and said channel oxide layer to said upper conductive oxide of said source and drain electrode, and each said filled contact opening being filled with a conductive metal; and
   (G) a gate electrode disposed atop said gate oxide material, wherein said gate electrode is laterally positioned between said first and second filled contact openings.

2. The structure of claim 1, wherein said substrate is selected from group consisting of strontium titanate (STO), lanthanum aluminate (LAO), strontium lanthanum aluminate (SLAO), barium strontium titanate (BST), and neodymium gallinate (NGO).

3. The structure of claim 1, wherein said lower conductive oxide is selected from the group of lanthanum strontium cobalt oxide (LSCO) and lanthanum nickel oxide (LNO).

4. The structure of claim 1, wherein said upper conductive oxide is strontium ruthanate (SRO).

5. The structure of claim 1, wherein said conductive metal filling said first and second filled contact openings is platinum or gold.

6. The structure of claim 1, wherein said channel oxide layer is selected from the group consisting of lanthanum cuprate (LCO), yttrium praseodymium barium cuprate (YPBCO), yttrium barium cuprate (YBCO), and neodymium cuprate (NCO).

7. The structure of claim 1, wherein said gate oxide material is selected from group consisting of strontium titanate (STO), lead zirconate titanate (PZT), strontium barium niobate (SBN), and barium strontium titanate (BST).

8. The structure of claim 1, wherein said gate electrode comprises platinum.

9. The structure of claim 1, further comprising a trench around the outside thereof.

* * * * *